US009601509B1

(12) United States Patent
Shin

(10) Patent No.: US 9,601,509 B1
(45) Date of Patent: Mar. 21, 2017

(54) SEMICONDUCTOR DEVICE HAVING SLIT BETWEEN STACKS AND MANUFACTURING METHOD OF THE SAME

(71) Applicant: SK hynix Inc., Icheon-si, Gyeonggi-do (KR)

(72) Inventor: Wan Cheul Shin, Yongin-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 14/996,556

(22) Filed: Jan. 15, 2016

(30) Foreign Application Priority Data

Aug. 24, 2015 (KR) ........................ 10-2015-0119086

(51) Int. Cl.
   *H01L 27/00* (2006.01)
   *H01L 27/115* (2006.01)
   *H01L 21/28* (2006.01)
   *H01L 21/822* (2006.01)

(52) U.S. Cl.
   CPC .. *H01L 27/11582* (2013.01); *H01L 21/28282* (2013.01); *H01L 21/8221* (2013.01); *H01L 27/11524* (2013.01); *H01L 27/11551* (2013.01); *H01L 27/11578* (2013.01)

(58) Field of Classification Search
   CPC ......... H01L 27/11578; H01L 27/11524; H01L 27/11551; H01L 21/8221
   See application file for complete search history.

(56) References Cited

U.S. PATENT DOCUMENTS

| 9,224,751 B2* | 12/2015 | Hyun | H01L 27/11524 |
| 2004/0171254 A1* | 9/2004 | Iijima | H01L 21/3065 438/689 |
| 2013/0161731 A1* | 6/2013 | Bin | H01L 29/78 257/329 |
| 2015/0069484 A1* | 3/2015 | Lee | H01L 29/66833 257/314 |
| 2015/0084115 A1* | 3/2015 | Kim | H01L 27/0207 257/324 |

(Continued)

FOREIGN PATENT DOCUMENTS

KR 1020130015694 A 2/2013
KR 1020140086670 A 7/2014

*Primary Examiner* — Ngan Ngo
(74) *Attorney, Agent, or Firm* — William Park & Associates Ltd.

(57) ABSTRACT

The present disclosure may provide a semiconductor device having a three-dimensional memory device with improved performance and reliability. The device may include a pipe gate having a pipe channel film embedded in the pipe gate. The device may include source-side channel and drain-side channel films coupled respectively to both ends of the pipe channel film. The device may include interlayer insulation films and conductive patterns alternately stacked and disposed over the pipe gate, the alternately stacked interlayer insulation films and conductive patterns surrounding the source-side channel film and the drain-side channel film. The device may include a slit disposed between the drain-side channel film and the source-side channel film and dividing the alternately stacked interlayer insulation films and conductive patterns into a source-side stack and a drain-side stack, the slit having a round shape at a bottom of the slit adjacent to the pipe gate.

10 Claims, 8 Drawing Sheets

(56) References Cited

U.S. PATENT DOCUMENTS

| | | | | |
|---|---|---|---|---|
| 2015/0171106 A1* | 6/2015 | Suh | H01L 27/11582 | 257/324 |
| 2015/0236036 A1* | 8/2015 | Shim | H01L 27/11582 | 438/268 |
| 2015/0243672 A1* | 8/2015 | Kim | H01L 27/1157 | 257/324 |
| 2015/0262678 A1* | 9/2015 | Kim | G11C 16/10 | 365/185.22 |
| 2015/0270165 A1* | 9/2015 | Hyun | H01L 21/76843 | 257/329 |
| 2015/0270281 A1* | 9/2015 | Lee | H01L 27/11582 | 257/314 |
| 2015/0279856 A1* | 10/2015 | Hyun | H01L 27/11524 | 257/329 |
| 2015/0287739 A1* | 10/2015 | Lee | H01L 27/11575 | 257/326 |
| 2015/0333186 A1* | 11/2015 | Yoo | H01L 21/28282 | 257/324 |
| 2015/0340370 A1* | 11/2015 | Kim | H01L 27/11578 | 365/185.18 |
| 2015/0364487 A1* | 12/2015 | Yun | H01L 27/1157 | 257/324 |
| 2016/0020221 A1* | 1/2016 | Oh | H01L 27/11582 | 257/324 |
| 2016/0071869 A1* | 3/2016 | Lee | H01L 27/11582 | 257/314 |
| 2016/0118395 A1* | 4/2016 | Son | H01L 27/11582 | 257/314 |
| 2016/0148948 A1* | 5/2016 | Kim | H01L 27/11582 | 257/324 |
| 2016/0172371 A1* | 6/2016 | Kim | H01L 29/1083 | 257/324 |
| 2016/0225697 A1* | 8/2016 | Lee | H01L 23/498 | |
| 2016/0233231 A1* | 8/2016 | Lee | H01L 27/11582 | |
| 2016/0254272 A1* | 9/2016 | Hyun | H01L 27/11582 | |

* cited by examiner

SEMICONDUCTOR DEVICE HAVING SLIT BETWEEN STACKS AND MANUFACTURING METHOD OF THE SAME

CROSS-REFERENCE TO RELATED APPLICATION

The present application claims priority to Korean patent application number 10-2015-0119086 filed on Aug. 24, 2015, in the Korean Intellectual Property Office, the entire disclosure of which is incorporated by reference herein.

BACKGROUND

1. Technical Field

The present disclosure relates generally to a semiconductor device and a method of manufacturing the same, and more particularly to a semiconductor device including a three-dimensional memory device and a method of manufacturing the same.

2. Related Art

A semiconductor device may include a memory device which stores data. The memory device may include a memory string coupled to a bit line at an end of the memory string and coupled to common source-line at the other end of the memory string. The memory string includes a plurality of memory cells coupled in series to one another.

In order to highly integrate the memory device, a three-dimensional memory device with a three-dimensional arrangement of the memory cells is being developed. The three-dimensional memory device may have a three-dimensional arrangement of the memory strings, each string including a plurality of memory cells coupled in series and a channel film coupled to the bit line at an end of the memory string and common source-line at the other end of the memory string. Recently semiconductor device manufacturers have been trying to achieve high performance and high reliability with respect to the three-dimensional memory devices.

DETAILED DESCRIPTION

Figure 1:
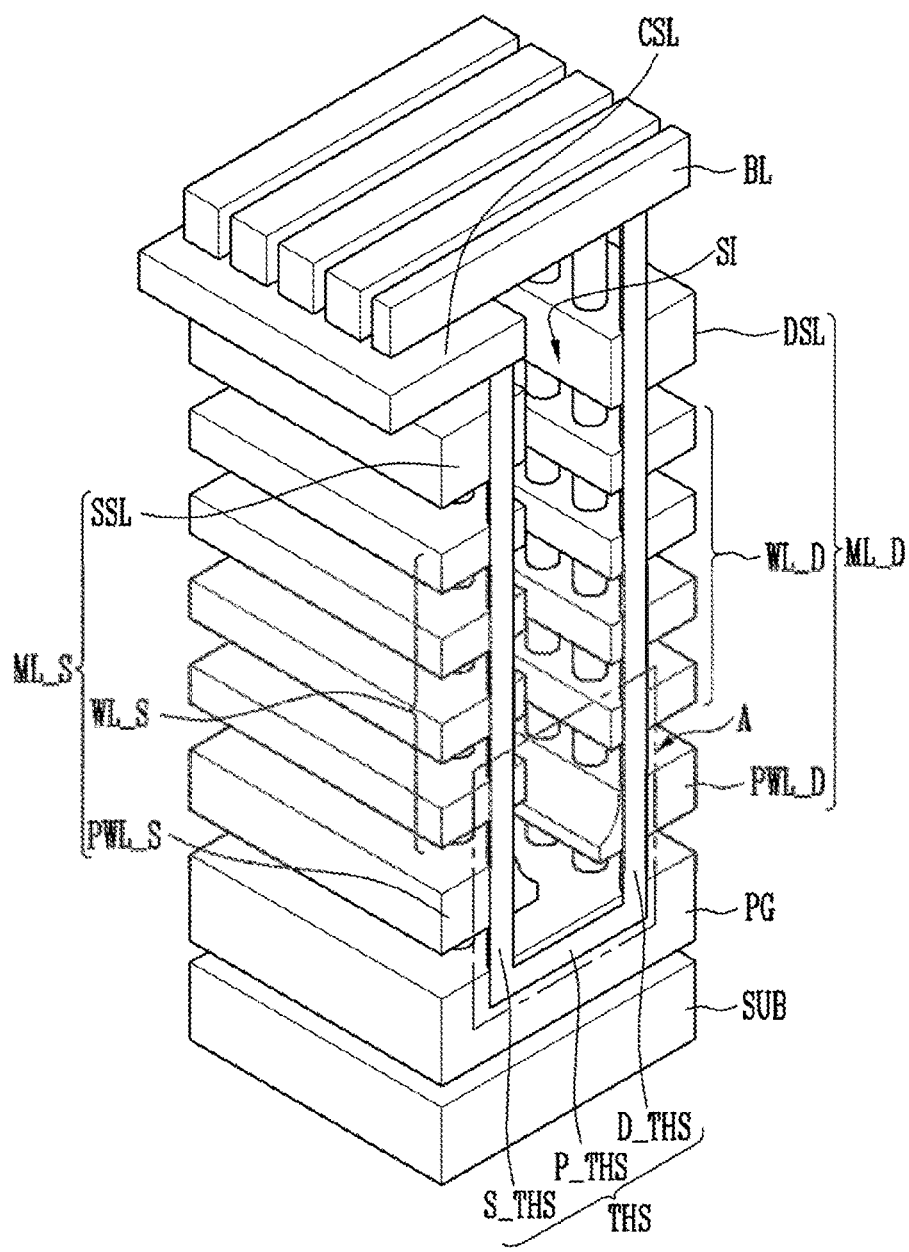
FIG. 1 is a perspective view illustrating an example of a memory string of a semiconductor device according to an embodiment of the present disclosure.

The present disclosure may provide a semiconductor device having a three-dimensional memory device with improved performance and reliability, and may provide a method of manufacturing the same.

In an embodiment of the present disclosure, a semiconductor device may include a pipe gate having a pipe channel film embedded in the pipe gate. The semiconductor device may include source-side channel and drain-side channel films coupled respectively to both ends of the pipe channel film. The semiconductor device may include interlayer insulation films and conductive patterns alternately stacked and disposed over the pipe gate, the alternately stacked interlayer insulation films and conductive patterns surrounding the source-side channel film and the drain-side channel film. The semiconductor device may include a slit disposed between the drain-side channel film and the source-side channel film and dividing the alternately stacked interlayer insulation films and conductive patterns into a source-side stack and a drain-side stack, the slit having a round shape at a bottom of the slit adjacent to the pipe gate.

In an embodiment of the present disclosure, a method of manufacturing a semiconductor device may include forming a preliminary structure including a pipe gate surrounding a pipe channel, a first interlayer insulation film on the pipe gate, a lower conductive film on the first interlayer insulation film, second interlayer insulation films and sacrificial films alternately stacked over the lower conductive film, and a source-side channel film and a drain-side channel film vertically extending through the alternately stacked second interlayer insulation films and sacrificial films, the source-side channel film and a drain-side channel film being connected respectively to both ends of the pipe channel. The method may include forming a slit between the source-side channel and drain-side channel films, the slit vertically passing through the alternately stacked second interlayer insulation films and sacrificial films and the lower conductive film, the slit having a rounded bottom facing the pipe gate. The method may include removing the sacrificial films through the slit to form openings. The method may include filling each of the openings with a conductive material to form each of main conductive patterns.

Examples of various embodiments are illustrated in the accompanying drawings and described further below. It will be understood that the discussion herein is not intended to limit the claims to the specific embodiments described. On the contrary, it is intended to cover alternatives, modifications, and equivalents as may be included within the spirit and scope of the present disclosure as defined by the appended claims.

Example embodiments will be described in more detail with reference to the accompanying drawings. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to" or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including" when used in this specification, specify the presence of the stated features, integers, s, operations, elements, and/or components, but do not preclude the presence or addition of one or more other features, integers, s, operations, elements, components, and/or groups thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

Semiconductor devices having three-dimensional memory devices and methods of manufacturing the semiconductor devices of the present disclosure are described herein in various embodiments.

FIG. 1 is a perspective view illustrating an example of a memory string of a semiconductor device according to an embodiment of the present disclosure. For the purpose of convenience in description, FIG. 1 illustrates an example that does not include an insulation film.

Referring to FIG. 1, a memory string may be arranged along a through-layer structure THS coupling a bit line BL and a common source line CSL to each other. Although FIG. 1 illustrates the through-layer structure THS with a U-shape, the through-layer structure THS may be formed in a variety of shapes including a W-shape. The bit line BL and common source line CSL may be vertically spaced from each other. In an example, the common source line CSL may be disposed below the bit line BL. Although not illustrated in FIG. 1, an insulation film may be disposed between the common source line CSL and bit line BL. The bit line BL and common source-line CSL may be made of a conductive material.

A pipe gate PG may be disposed below the bit line BL and common source-line CSL. The pipe gate PG may be made of a conductive material.

A drain-side stack ML_D may be disposed between the pipe gate PG and bit line BL, and a source-side stack ML_S may be disposed between the pipe gate PG and common source-line CSL. The drain-side stack ML_D and source-side stack ML_S may be separated by a slit SI. The drain-side stack ML_D and source-side stack ML_S may have the same or substantially the same height as one another.

The drain-side stack ML_D may include drain-side conductive patterns PWL_D, WL_D, and DSL, which are vertically arranged and spaced apart from one another. It may be understood that although not illustrated, each of the drain-side conductive patterns PWL_D, WL_D, DSL may be disposed between interlayer insulation films. The drain-side conductive patterns may include a drain-side lower conductive pattern PWL_D adjacent to the pipe gate PG, and drain-side main conductive patterns WL_D, and DSL disposed above the drain-side lower conductive pattern PWL_D. The drain-side lower conductive pattern PWL_D may act as a dummy word line to suppress a threshold voltage shift of a pipe transistor coupled to the pipe gate PG. The drain-side main conductive patterns may include drain-side word lines WL_D and a drain select line DSL disposed above the drain-side word lines WL_D. The drain select line DSL between the drain-side word lines WL_D and bit line BL may include one or more vertically arranged lines. The drain-side word lines WL_D may be coupled respectively to vertically arranged drain-side memory cells. The drain select line DSL may be connected to the drain select transistor.

The source-side stack ML_S may include source-side conductive patterns PWL_S, WL_S, and SSL, which are vertically arranged and spaced apart from one another. Although not illustrated, the source-side conductive patterns PWL_S, WL_S, and SSL each may be disposed between interlayer insulation films. The source-side conductive patterns may include source-side lower conductive pattern PWL_S adjacent to the pipe gate PG, and source-side main conductive patterns WL_S, and SSL disposed above the source-side lower conductive pattern PWL_S. The source-side lower conductive pattern PWL_S may serve as a dummy word line to prevent a threshold voltage shift of a pipe transistor coupled to the pipe gate PG. The source-side main conductive patterns may include source-side word lines WL_S and a source select line SSL disposed above the source-side word lines WL_S. The source select line SSL disposed between the source-side word lines WL_S and common source line CSL may include one or more vertically arranged lines. The source-side word lines WL_S may be coupled respectively to source-side memory cells which are vertically arranged. The source select line SSL may be coupled to the source select transistor.

The drain-side main conductive patterns WL_D, and DSL and source-side main conductive patterns WL_S, and SSL all may have a different conductive material from a conductive material of the pipe gate PG. In an embodiment, the drain-side main conductive patterns WL_D, and DSL and source-side main conductive patterns WL_S, and SSL may be formed of a conductive material with a lower resistance than that of the pipe gate PG. In an example, the pipe gate PG may be formed of polysilicon, whereas the drain-side main conductive patterns WL_D, and DSL and source-side main conductive patterns WL_S, and SSL may be formed of a metal such as tungsten or the like.

The drain-side lower conductive pattern PWL_D and the source-side lower conductive pattern PWL_S may be formed by dividing a lower conductive film by the slit SI. Here, the lower conductive film may be formed of a stack of different material layers. The lower conductive film may be formed of a stack of material layers that are different from one another. The material layers of the lower conductive film may have etching selectivities different from each other. The lower conductive film may be etched during the formation of the slit SI and may be divided into the drain-side lower conductive pattern PWL_D and the source-side lower conductive pattern PWL_S. During the formation of the slit SI, the etching may be controlled by using the etching selection ratio between the different material layers. In this way, the slit SI may pass through the lower conductive film so as to divide the lower conductive film into the drain-side lower conductive pattern PWL_D and source-side lower conductive pattern PWL_S while controlling the etching process so that a bottom of the slit SI does not reach the pipe gate PG. During the etching process, a lower portion of the slit SI may be formed in between the drain-side lower conductive pattern PWL_D and source-side lower conductive pattern PWL_S. The slit SI may extend to the pipe gate PG and gradually decrease in width at the lower portion of the slit SI. For example, the slit SI may gradually decrease in width at the lower portion formed in between the drain-side lower conductive pattern PWL_D and source-side lower conductive pattern PWL_S. A shape of the slit SI may vary depending on a vertical arrangement of the material layers of the lower conductive film. The material layer adjacent to the pipe gate PG may be made of a conductive material different from that of the pipe gate PG, and the material layer adjacent to the word lines WL_S and WL_D may be made of a conductive material different from that of the word lines WL_S and WL_D.

The through-layer structure THS may include a drain-side-through-layer structure D_THS vertically extending through the drain-side stack ML_D, a source-side-through-layer structure S_THS vertically extending through the source-side stack ML_S, and a pipe-through-layer structure P_THS vertically and horizontally extending through the pipe gate PG to connect the drain-side-through-layer structure D_THS and source-side-through-layer structure S_THS. The through-layer structure THS may have a variety of shapes. In an example embodiment, the through-layer structure THS may include a channel film surrounded with at least three films such as a blocking insulation film, data storage film, and tunnel insulation film. The channel film may be formed in a tube structure in which the channel film surrounds a core insulation film formed in a center portion of the through-layer structure THS. The channel film may be formed in a cylindrical structure which is formed by filling the center portion of the through-layer structure THS on the tunnel insulation film. The channel film may be formed in a combination of the tube and cylindrical structures. Each of the blocking insulation film, data storage film and tunnel insulation film may be disposed along and on an outer face of the through-layer structure THS. The tunnel insulation film may be made of a silicon oxide film, and the data storage film may be made of a charge-trapping film. In an example embodiment, the data storage film may be made of a silicon nitride film. The blocking insulation film may include a silicon oxide film and/or a high-K dielectric film (e.g., a film having higher dielectric constant than the silicon oxide film). The channel film of the through-layer structure THS may be coupled respectively to the bit line BL and common source-line CSL at both ends of the through-layer structure THS.

In an embodiment, each source-side memory cell is disposed at each intersection of the through-layer structure THS and source-side word lines WL_S, and a source select transistor is formed at an intersection of the through-layer structure THS and source select line SSL. Similarly, each drain-side memory cell is disposed at each intersection of the through-layer structure THS and drain-side word lines WL_D, and a drain select transistor is formed at an intersection of the through-layer structure THS and drain select line DSL. Further, a pipe transistor is formed at an intersection of the through-layer structure THS and pipe gate PG. The source select transistor, source-side memory cells, pipe transistor, drain-side memory cells, and drain select transistor, all of which are coupled to each other in series via the channel film of the through-layer structure THS, are arranged along the single through-layer structure THS. This arrangement may form a single memory string. The memory string may further include a source-side dummy cell at an intersection of the through-layer structure THS and source-side lower conductive pattern PWL_S, and a drain-side dummy cell at an intersection of the through-layer structure THS and drain-side lower conductive pattern PWL_D.

Figure 2A:
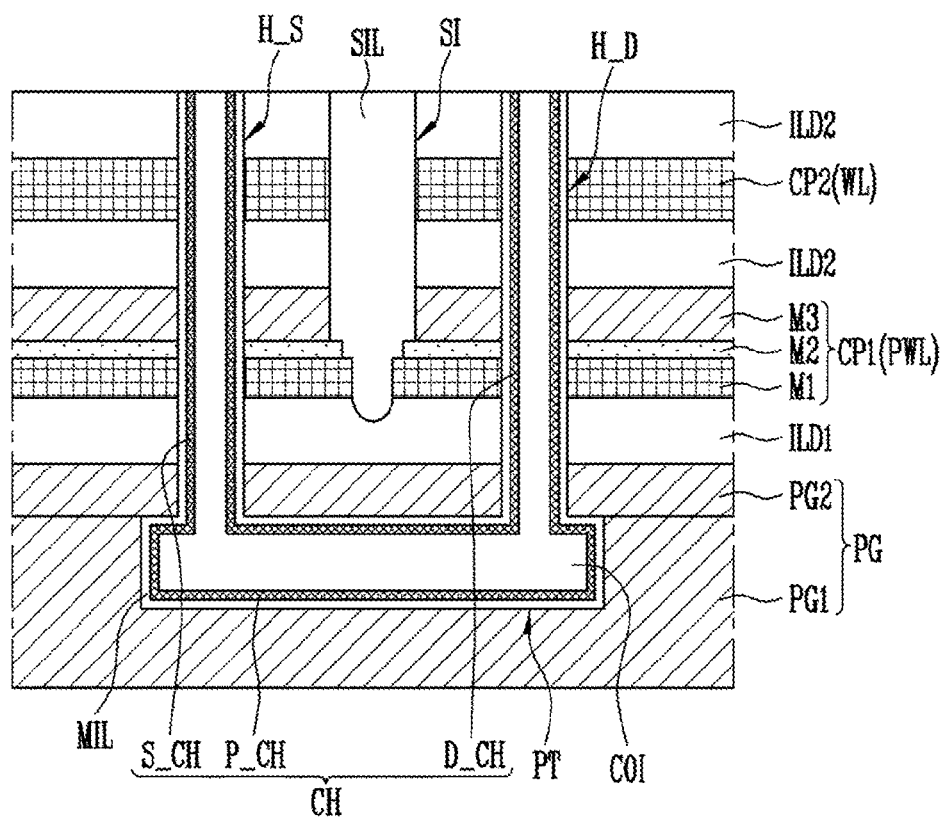
FIG. 2A and FIG. 2B are cross-sectional views illustrating a variety of examples of "A" region in FIG. 1.
Figure 2B:
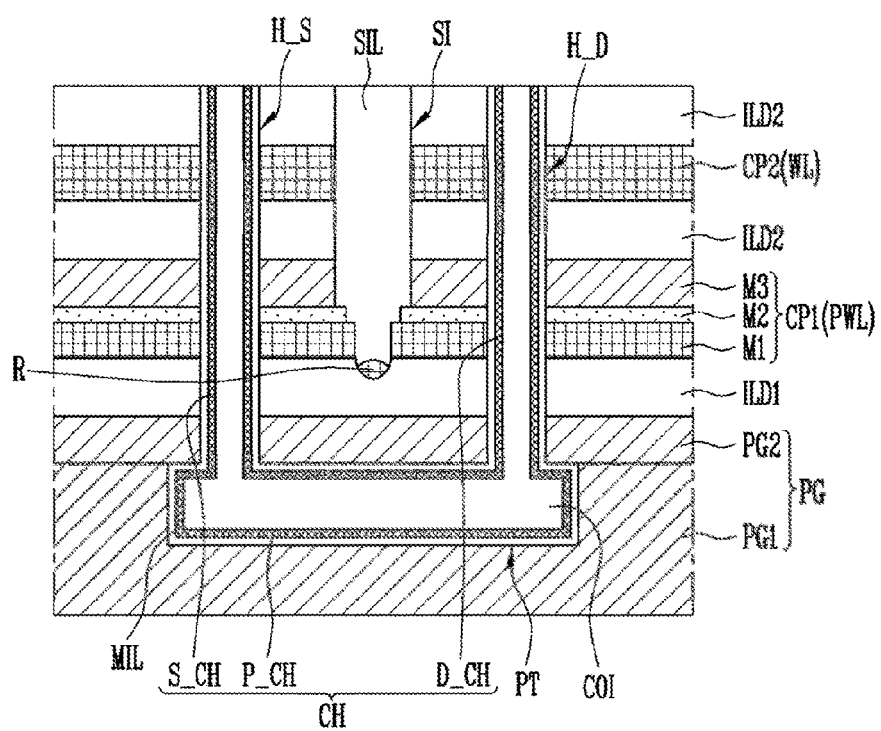

FIG. 2A and FIG. 2B are cross-sectional views illustrating a variety of examples of "A" region in FIG. 1.

Referring to FIG. 2A and FIG. 2B, the through-layer structure THS (as illustrated in FIG. 1) may include the channel film CH, and a multi-layered film MIL surrounding the channel film CH. The multi-layered film MIL may include the tunnel insulation film surrounding the channel film CH, the data storage film surrounding the tunnel insulation film, and the blocking insulation film surrounding the data storage film. The channel film CH may be formed in the tube structure surrounding the core insulation film COI. Alternatively, the channel film CH may be formed in the cylindrical without the core insulation film COI.

The channel film CH may include a pipe channel film P_CH, a source-side channel film S_CH, and a drain-side channel film D_CH.

The pipe channel film P_CH may be disposed in a pipe hole PT formed in the pipe gate PG. That is, the pipe channel film P_CH may be embedded in the pipe gate PG. The pipe gate PG may be divided into a first pipe gate PG1 including the pipe hole PT and a second pipe gate PG2 formed on the first pipe gate PG1 so as to cover the pipe hole PT and pipe channel film P_CH.

The source-side channel film S_CH and drain-side channel film D_CH may be coupled respectively to both ends of the pipe channel film P_CH, and may extend vertically upwards. The source-side channel film S_CH and drain-side channel film D_CH may be surrounded with the interlayer insulation films ILD1, and ILD2 and conductive patterns CP1, and CP2 alternately stacked over the pipe gate PG in a vertical direction.

The interlayer insulation films ILD1, and ILD2 may be divided into a first interlayer insulation film ILD1 disposed between the pipe gate PG and the conductive patterns CP1 and CP2, and second interlayer insulation films ILD2 disposed above the first interlayer insulation film ILD1. One of the conductive patterns CP2 may be disposed between the adjacent second interlayer insulation films ILD2.

A lower conductive pattern CP1 of the conductive patterns CP1 and CP2 may be adjacent to the pipe gate PG, and may be formed of a stack of different materials films M1 to M3 as mentioned above in connection to FIG. 1. The main conductive patterns CP2 disposed above the lower conductive pattern CP1 may be formed of a different material from the pipe gate PG as mentioned above in connection to FIG. 1. The lower conductive pattern CP1 may act as a dummy word line PWL. The main conductive patterns CP2 may serve as the word lines WL.

In an example embodiment, the lower conductive pattern CP1 may include first and second conductive films M1 and M3 vertically arranged. The first and second conductive films M1 and M3 may be made of different materials from one another. The first conductive film M1 facing in a direction where the pipe gate PG is disposed may be formed of a different material from the pipe gate PG. The second conductive film M3 facing in a direction where the main conductive patterns CP2 is disposed may be formed of a different material from the main conductive patterns CP2. In an example embodiment, the first and second pipe gates PG1 and PG2 forming the pipe gate PG may be made of polysilicon, and the first conductive film M1 may be made of a metal film. The first conductive film M1 may be made of a tungsten. The second conductive film M3 may be formed of the same conductive material as the pipe gate PG. In an example embodiment, the second conductive film M3 may be made of polysilicon.

The lower conductive pattern CP1 may include an antireaction film M2 disposed between first and second different conductive films M1 and M3. The anti-reaction film M2 may suppress an interaction that may occur between the first and second conductive films M1 and M3 and may be made of a metal nitride film. In an example embodiment, the first conductive film M1 may be made of tungsten, the second conductive film M3 may be made of polysilicon, and the anti-reaction film M2 may be made of a tungsten nitride film.

The second interlayer insulation films ILD2 and conductive patterns CP1 and CP2 may be vertically passed through by the slit SI and the stack may be divided into the source-side stack and drain-side stack as mentioned above in connection to FIG. 1. The bottom of the slit SI may be spaced apart from the pipe gate PG. At least a portion of the first interlayer insulation film ILD1 may remain between the slit SI and pipe gate PG. The bottom of the slit SI may be formed in a round shape. The slit SI may be filled with a slit insulation film SIL. The slit insulation film SIL formed in the slit SI may be wide at the top and narrow at the bottom. For example, the slit insulation film SIL may have a bottom formed in a round shape.

The slit SI may disposed between the source-side channel film S_CH and drain-side channel film D_CH. The source-side channel film S_CH may fill a source-side hole H_S, and the drain-side channel film D_CH may fill a drain-side hole H_D. The source-side hole H_S may pass through the source-side stack including the conductive patterns CP1 and CP2 and interlayer insulation films ILD1 and ILD2, and may communicate with the pipe hole PT. The drain-side hole H_D may pass through the drain-side stack including the conductive patterns CP1 and CP2 and interlayer insulation films ILD1 and ILD2, and may communicate with the pipe hole PT.

According to an embodiment of the present disclosure where the lower conductive pattern CP1 may be made of the stack of the different materials films M1 to M3, the different materials films M1 to M3 each may act as an etch stop layer by controlling an etching recipe during the formation of the slit SI. As a result, etch-induced damage that may occur at the pipe gate PG during etching the slit SI may be reduced, and a level of the bottom of the slit SI may be easily controlled so as to be spaced apart from the pipe gate PG. As a result, the pipe transistor coupled to the pipe gate PG may have enhanced performance and reliability.

Further, in the course of etching the lower conductive pattern CP1 having a multi-layered or multi-laminated structure, the bottom of the slit SI may be formed in a round shape. This round-shaped bottom may allow the bottom of the slit insulation film SIL to be formed in a round shape.

Furthermore, the main conductive patterns CP2 may be formed via a sequence of removing, through the slit SI, sacrificial films (not illustrated) respectively disposed between the interlayer insulation films ILD1 and ILD2, filling the removed region of the sacrificial films with the conductive material, and etching the conductive material and allowing the conductive material to remain only in the removed region of the sacrificial films. During the sequence, the conductive material may remain in the bottom of the slit SI as illustrated in FIG. 2B. Since the bottom of the slit SI may be formed in a round shape, the conductive material R remaining in the bottom of the slit SI may not have a peak corner facing the pipe gate PG.

When the slit SI bottom has such a peak corner, the conductive material R may also have a peak corner. If the conductive material R has the peak corner, an electric field may be concentrated on the peak corner of the conductive material R. This may lead to performance degradation of the pipe transistor coupled to the pipe gate PG.

In an embodiment of the present disclosure, despite the remaining conductive material R in the slit SI bottom, the round shape of the slit SI bottom may reduce the electric field concentration on the remaining conductive material R and provide enhanced performance and reliability.

FIG. 3A to FIG. 3F are cross-sectional views illustrating an example of a method of manufacturing a semiconductor device according to an embodiment of the present disclosure.

Figure 3A:
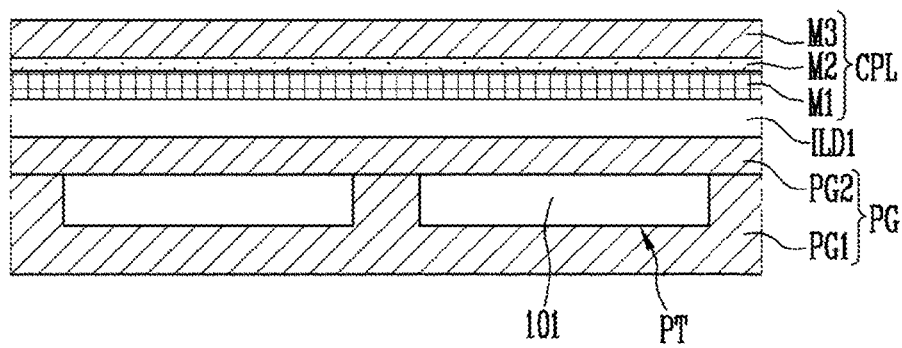
FIG. 3A to FIG. 3F are cross-sectional views illustrating an example of a method of manufacturing a semiconductor device according to an embodiment of the present disclosure.

Referring to FIG. 3A, a pipe gate PG having a pipe hole PT filled with a first sacrificial film 101 may be formed. An example of the formation of the pipe gate PG will be described below.

First, a first pipe gate PG1 may be etched to form a pipe hole PT. Next, the pipe hole PT may be filled with a first sacrificial film 101. The first pipe gate PG1 may be formed of polysilicon. Then, a second pipe gate PG2 is formed on the first pipe gate PG1. The second pipe gate PG may be formed of polysilicon. The second pipe gate PG2 may be in contact with the first pipe gate PG1. The first and second pipe gates PG1 and PG2 may be etched in a desired pattern to form a pipe gate PG.

After the formation of the pipe gate PG, a first interlayer insulation film ILD1 may be formed on the pipe gate PG. The first interlayer insulation film ILD1 may be made of a silicon oxide film. Thereafter, a lower conductive film CPL may be formed on the first interlayer insulation film ILD. The lower conductive film CPL may be formed of a multi-laminated stack of different materials films M1 to M3. The different materials films M1 to M3 may have different etching selection ratios over each other. In an example embodiment, the lower conductive film CPL may be formed of a lower first conductive film M1 and an upper second conductive film M3 which are vertically arranged so that the etching selectivity difference may be utilized in an etching process that will be carried out later on. The lower conductive film CPL may further include an anti-reaction film M2 between the first conductive film M1 and second conductive film M3. The first conductive film M1 may be made of a conductive material different from the pipe gate PG, so that, in the etching process of the first conductive film M1, the pipe gate PG may not be etched. The first conductive film M1 may be made of a conductive material having an etching selectivity over the pipe gate PG. The second conductive film M3 may be formed of a material that is different from first and second material films that will be formed later on. The second conductive film M3 may be made of a conductive material having an etching selectivity over the first material films and second material films, so that the second conductive film M3 may act as an etch stop layer in subsequent etching processes of the first material films and second material films. In an example embodiment, the first conductive film M1 may include a metal film. The second conductive film M3 may be formed of polysilicon. The anti-reaction film M2 may include a metal nitride film.

Figure 3B:
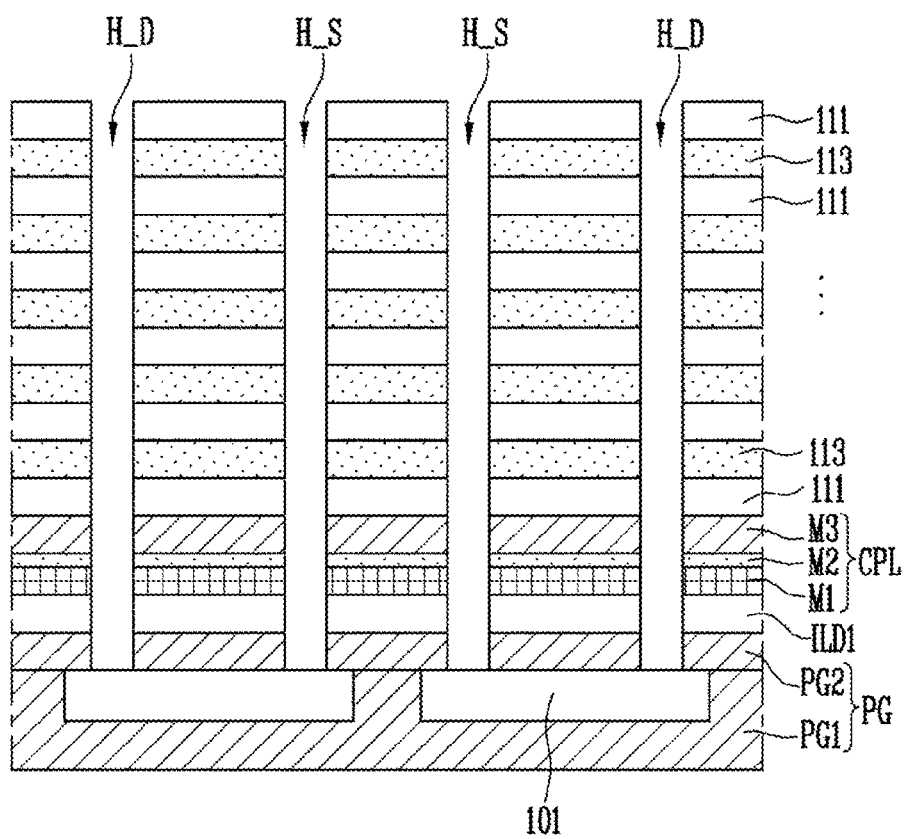

Referring to FIG. 3B, the first material films 111 and second material films 113, which are alternately stacked, may be formed on the lower conductive film CPL. The first material films 111 may act as a second interlayer insulation film, and the second material films 113 may serve as a second sacrificial film. In an example embodiment, the first material films 111 may be formed of the same material as the first interlayer insulation film ILD1. For example, the first material films 111 may be formed of silicon oxide. The second material films 113 may be formed of a different material from the first material films 111. For example, the second material films 113 may be formed of a material having an etching selectivity over the first material films 111. In an example embodiment, the second material films 113 may be made of a silicon nitride film.

Next, the first material films 111 and second material films 113 may be vertically passed through by the source-side hole H_S and drain-side hole H_D to expose the first sacrificial film 101. The source-side hole H_S and drain-side hole H_D may pass through the second pipe gate PG so as to expose the first sacrificial film 101.

Figure 3C:
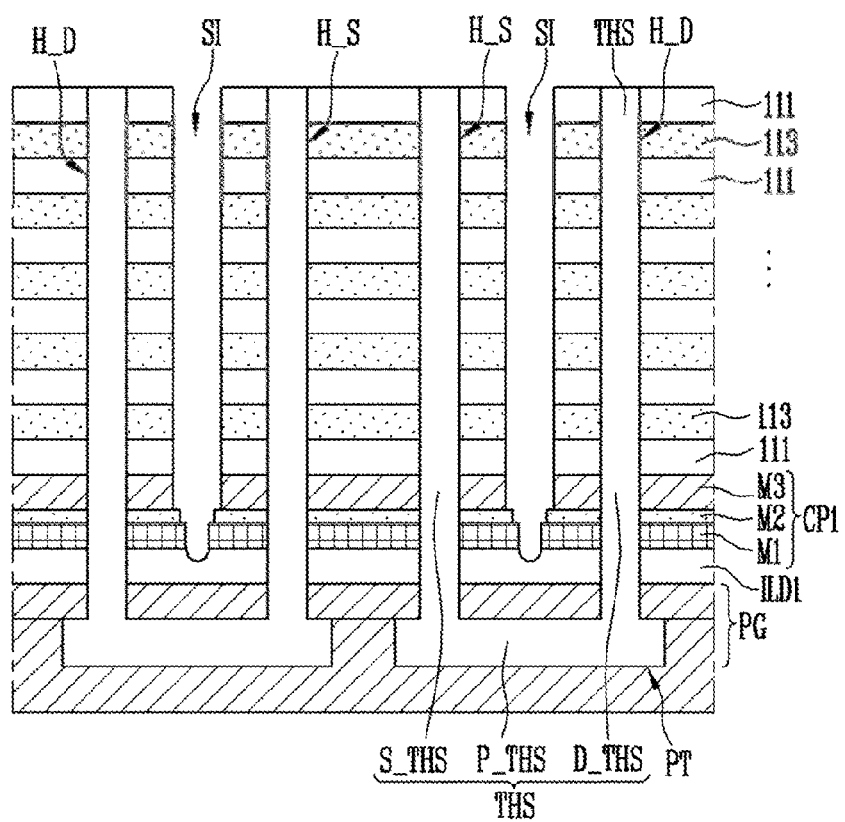

Referring to FIG. 3C, through the source-side hole H_S and drain-side hole H_D, the first sacrificial film 101 may be removed so as to expose the pipe hole PT. Thereafter, a through-layer structure THS may be formed within the source-side hole H_S, drain-side hole H_D, and pipe hole PT. The through-layer structure THS may be formed by filling the source-side hole H_S to form the source-side-through-layer structure S_THS, by filling the drain-side hole H_D to form a drain-side-through-layer structure D_THS, and by filling the pipe hole PT to form a pipe-through-layer structure P_THS. The through-layer structure THS may include the channel film, core insulation film, and multi-layered structure as mentioned above in connection to FIG. 2A and FIG. 2B. The channel film may include a pipe channel film, a source-side channel film and a drain-side channel film as mentioned above in connection to FIG. 2A and FIG. 2B. The pipe channel film may be included in the pipe-through-layer structure P_THS. The source-side channel film may be included in the source-side-through-layer structure S_THS. The drain-side channel film may be included in the drain-side-through-layer structure D_THS.

In this way, a preliminary structure may be formed. Here, the preliminary structure may include the pipe gate PG surrounding the pipe channel, the first interlayer insulation film ILD1 and lower conductive film CPL vertically arranged on the pipe gate PG, the first material films 111 and second material films 113 alternately stacked on the lower conductive film CPL in a vertical direction, and the source-side channel film and drain-side channel film passing through the first material films 111 and second material films 113 and being coupled to the pipe channel.

The slit SI vertically extending through the first material films 111, second material films 113 and lower conductive film CPL may be formed by etching the first material films 111, second material films 113 and lower conductive film (e.g., CPL in FIG. 3B) disposed between the source-side-through-layer structure S_THS and drain-side-through-layer structure D_THS.

The etching processes for the formation of the slit SI may include a first etching process for etching the first material films 111 and second material films 113 using a first etching material, a second etching process for etching the second conductive film M3 of the lower conductive film using a second etching material, and a third etching process for etching the first conductive film M1 of the lower conductive film using a third etching material. The anti-reaction film M2 may be etched using the second etching process and/or third etching process. In the first etching process, the second conductive film M3 may act as an etch stop layer to suppress an extension of the slit SI into the pipe gate PG. In the second etching process, the first conductive film M1 may act as an etch stop layer to suppress an extension of the slit SI into the pipe gate PG. In an embodiment of the present disclosure, by controlling etching recipes for the formation of the vertical arrangement of the first and second conductive film M1 and M3 of different materials and the formation of the slit SI, the slit SI may not extend into the pipe gate PG, and the first interlayer insulation film ILD1 may remain between the slit SI and pipe gate PG.

By utilizing the difference in etching rate during the etching progress, the bottom end of the slit SI in the first interlayer insulation film ILD1 may be formed in a round shape. The slit SI may pass through the lower conductive film and divide the lower conductive film into the lower conductive patterns CP1. The side wall portions of the lower conductive patterns CP1 being in contact with the slit SI may be patterned in a step structure via the etching processes for the formation of the slit SI.

Figure 3D:
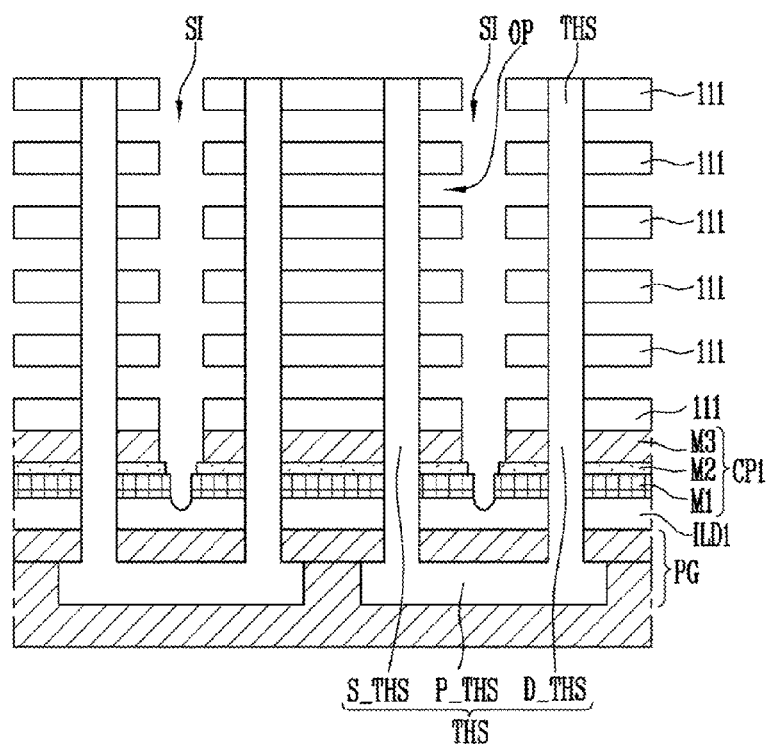

Referring to FIG. 3D, the second material films (113 in FIG. 3C) may be removed through the slit SI to form openings OP between the first material films 111.

Figure 3E:
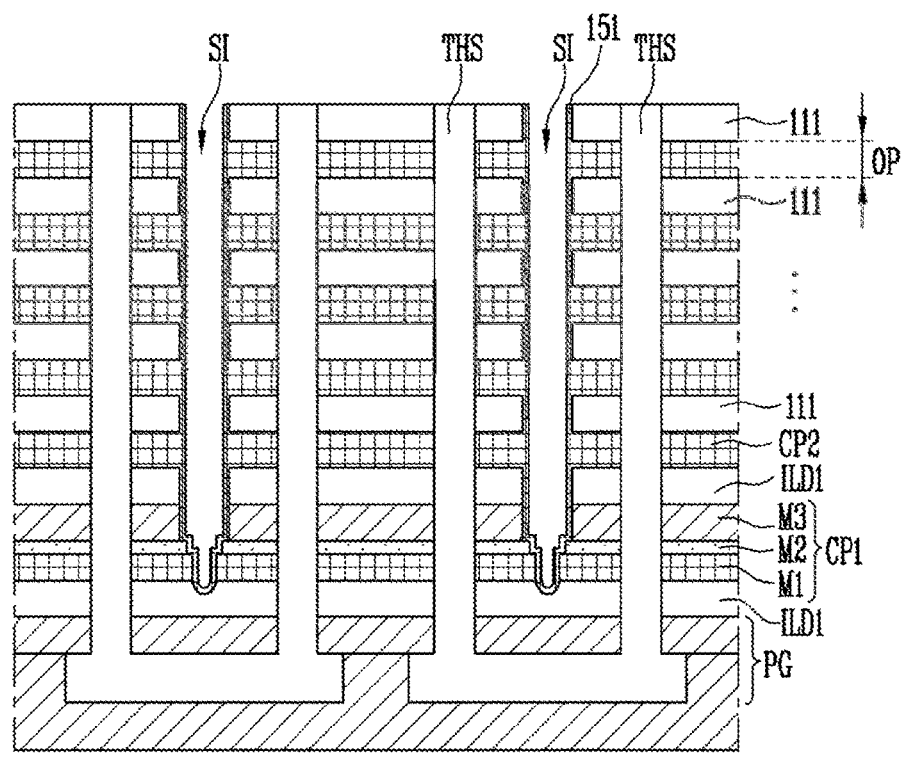

Referring to FIG. 3E, the openings OP may be filled with a third material film 131 which is carried through the slit SI. Here, the third material film 131 may act as a conductive film for the main conductive patterns. In an example embodiment, the third material film 131 may be made of metal such as tungsten or the like. The third material film 131 may be formed along side wall and bottom of the slit SI.

Figure 3F:
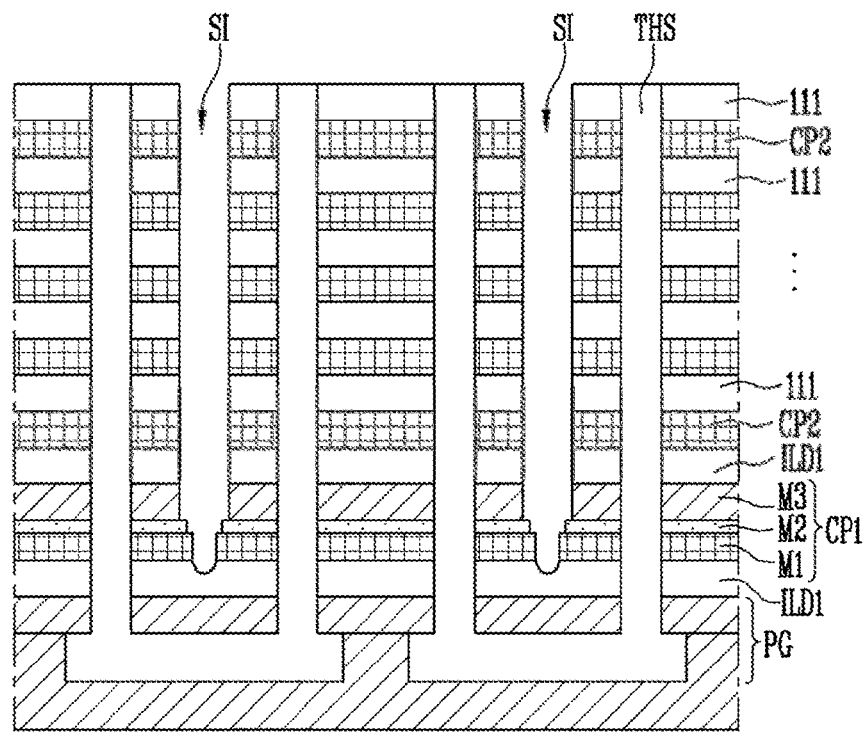

Referring to FIG. 3F, the third material film may be partially removed from the slit SI so that the third material film may remain only in the openings (OP in FIG. 3E) and the side wall of the slit SI side-wall may be exposed. In this way, the main conductive patterns CP2, which surrounds the through-layer structure THS and are divided by the slit SI, may be formed. The first material films 111 alternately stacked with the main conductive patterns CP2 and divided by the slit SI may act as the second interlayer insulation films illustrated in FIG. 2A and FIG. 2B.

In an embodiment, the slit bottom may be formed in a round shape. Thus, despite the conductive material remaining in the slit bottom, the electric field may not be concentrated on the slit bottom. As a result, the semiconductor device having the three-dimensional memory device may have enhanced performance and reliability.

Figure 4:
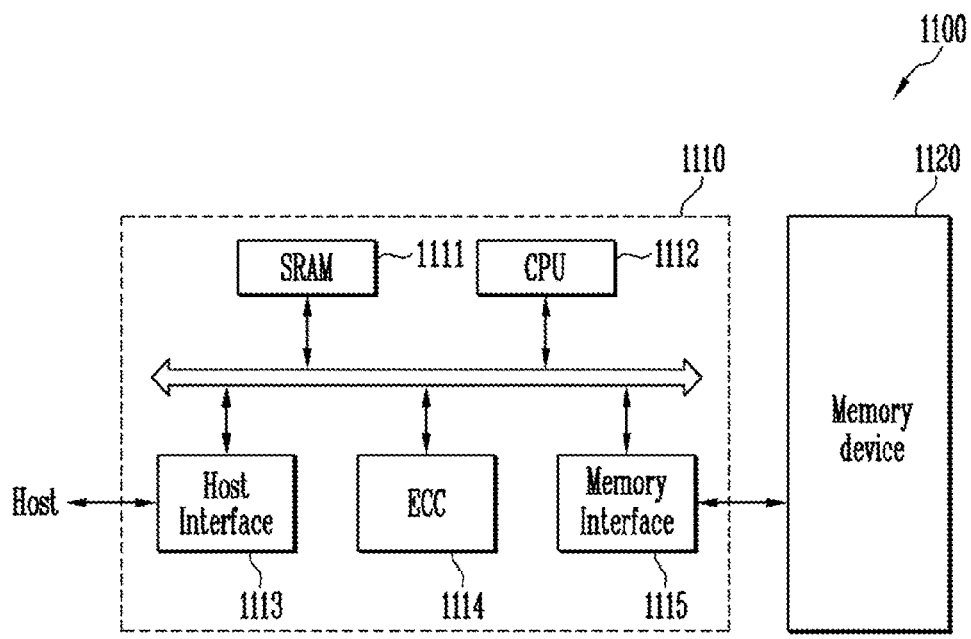
FIG. 4 is a diagram illustrating an example of a memory system in accordance with an embodiment of the present disclosure.

FIG. 4 is a diagram illustrating an example of a memory system in accordance with an embodiment of the present disclosure.

Referring to FIG. 4, a memory system 1100 in accordance with the present disclosure may include a memory device 1120 and a memory device controller 1110.

The memory device 1120 may include the configuration as mentioned above in FIG. 1 to FIG. 3F. That is, the memory device 1120 may include the stack having the division slit formed therein with the rounded bottom and the conductive patterns surrounding the channel films. Further, the memory device 1120 may be implemented in a multi-chips package including a plurality of flash memory chips.

The memory device controller 1110 may be configured to control the memory device 1120, and may include a SRAM 1111, CPU 1112, host interface 1113, ECC 1114, and memory interface 1115. The SRAM 1111 may be employed as a work memory for the CPU 1112. The processing unit 1112 may execute control operations of the controller 1110 and provide processed data. The host interface 1113 may have a data exchange protocol of a host (e.g., system) connected to the memory system 1100. The error correction block 1114 may detect and correct errors contained in data read from the memory device 1120. The memory interface 1115 may interface with the semiconductor memory device 1120 according to various embodiments of the present disclosure. The controller 1110 of the memory system 1100 according to various embodiments of the present disclosure may be further provided with a ROM (not shown) to store code data to interface with the host system or host.

In the memory system 1100 as shown in FIG. 4, the semiconductor memory device 1120 and the controller 1110 may be combined to be implemented as a memory card or semiconductor disk device (e.g., Solid State Disk or SSD). In an example embodiment, when the memory system 1100 is implemented in the SSD, the external devices (e.g., a host system) (not shown) and the controller 1110 may be connected to each other via various interfaces. For instance, the interfaces may include standard interfaces such as Multimedia Card (MMC), Enhanced Small Device Interface (ESDI), Parallel Advanced Technology Attachment (PATA), Serial Advanced Technology Attachment (SATA), Small Computer Small Interface (SCSI), Serial Attached SCSI (SAS), Universal Serial Bus (USB), PCI express (PCIe), integrated device electronics (IDE) and the like.

Figure 5:
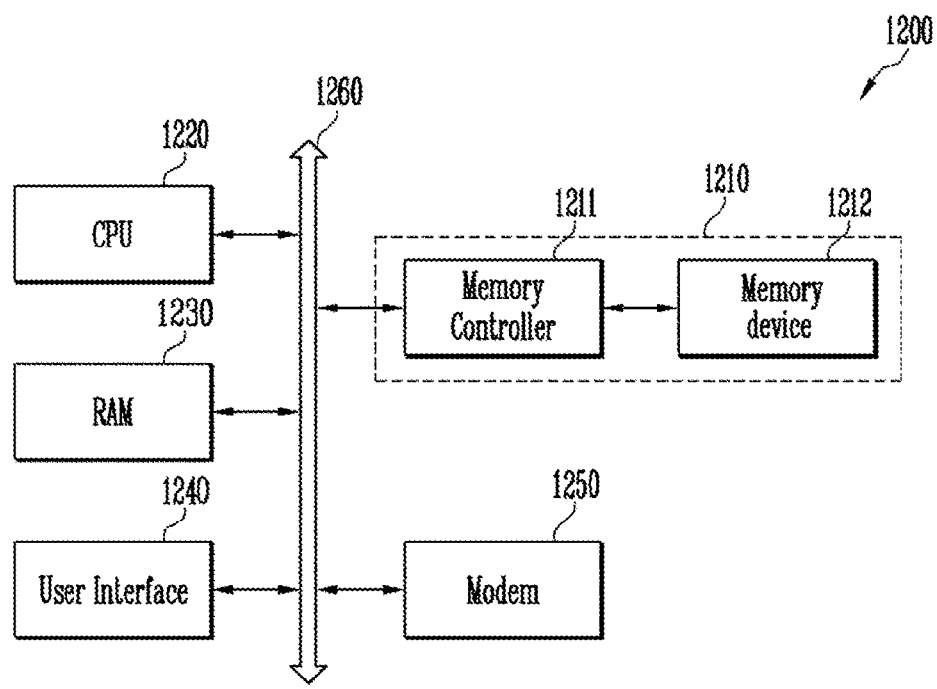
FIG. 5 is a diagram illustrating an example of a computing system in accordance with an embodiment of the present disclosure.

FIG. 5 is a diagram illustrating an example of a computing system in accordance with an embodiment of the present disclosure.

Referring to FIG. 5, the computing system 1200 in accordance with an embodiment of the present disclosure may include a CPU 1220, RAM 1230, user interface 1240, modem 1250, and memory system 1210, all of which are electrically connected to each other via a system bus 1260. Further, when the computing system 1200 is implemented in a mobile device, the computing system 1200 may be further provided with a battery (not shown) to supply an operation voltage thereof, and may be further provided with an application chipset, camera image processor (CIS), mobile DRAM, etc.

The memory system 1210 may include the memory device 1212, and the memory device controller 1211 as illustrated in FIG. 4.

The above description is not to be taken in a limiting sense, but is made merely for the purpose of describing the general principles of example embodiments, many additional embodiments of this invention are possible. It is understood that no limitation of the scope of the invention is thereby intended. The scope of the disclosure should be determined with reference to the Claims. Reference throughout this specification to "one embodiment," "an embodiment," or similar language means that a particular feature, structure, or characteristic that is described in connection with the embodiment is included in at least one embodiment of the present disclosure. Thus, appearances of the phrases "in one embodiment," "in an embodiment," and similar language throughout this specification may, but do not necessarily, all refer to the same embodiment.

What is claimed is:

1. A semiconductor device comprising:
    a pipe gate having a pipe channel film embedded in the pipe gate;
    source-side channel and drain-side channel films coupled respectively to both ends of the pipe channel film;
    interlayer insulation films and conductive patterns alternately stacked and disposed over the pipe gate, the alternately stacked interlayer insulation films and conductive patterns surrounding the source-side channel film and the drain-side channel film; and
    a slit disposed between the drain-side channel film and the source-side channel film and dividing the alternately stacked interlayer insulation films and conductive patterns into a source-side stack and a drain-side stack, the slit having a round portion at a bottom of the slit,
    wherein the round portion of the slit is adjacent to the pipe gate to reduce an electric field concentration on a pipe transistor coupled to the pipe gate.

2. The device of claim 1, wherein the conductive patterns include a lower conductive pattern adjacent to the pipe gate, the lower conductive pattern being made of materials films that are different from one another and vertically arranged.

3. The device of claim 1, wherein the conductive patterns include a lower conductive pattern adjacent to the pipe gate, the lower conductive pattern including a stack of first and second conductive films.

4. The device of claim 3, wherein the lower conductive pattern further includes an anti-reaction film between the first conductive film and the second conductive film.

5. The device of claim 4, wherein the anti-reaction film includes a metal nitride film.

6. The device of claim 3, wherein the first conductive film includes a metal film.

7. The device of claim 3, wherein the second conductive film is made of the same material as the pipe gate.

8. The device of claim 3, wherein the conductive patterns include main conductive patterns disposed above the lower conductive pattern, and the second conductive film is made of a different material from the main conductive patterns.

9. The device of claim 3, wherein the second conductive film includes polysilicon.

10. The device of claim 1, wherein the bottom of the slit is spaced apart from the pipe gate.

* * * * *